United States Patent
Han et al.

(10) Patent No.: US 12,113,887 B2
(45) Date of Patent: Oct. 8, 2024

(54) DIGITAL CLOCK AND DATA RECOVERY CIRCUIT AND FEEDBACK LOOP CIRCUIT INCLUDING THE SAME

(71) Applicant: ELECTRONICS AND TELECOMMUNICATIONS RESEARCH INSTITUTE, Daejeon (KR)

(72) Inventors: Seon-Ho Han, Daejeon (KR); Young-Su Kwon, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 17/881,417

(22) Filed: Aug. 4, 2022

(65) Prior Publication Data

US 2023/0125872 A1    Apr. 27, 2023

(30) Foreign Application Priority Data

Oct. 22, 2021   (KR) .......................... 10-2021-0141478

(51) Int. Cl.
*H04L 7/033*    (2006.01)
*H03L 7/08*     (2006.01)
*H03L 7/093*    (2006.01)

(52) U.S. Cl.
CPC ............ *H04L 7/033* (2013.01); *H03L 7/0807* (2013.01); *H03L 7/093* (2013.01)

(58) Field of Classification Search
CPC ..... H04L 7/033; H04L 7/0334; H04L 7/0331; H03L 7/0807; H03L 7/093; H03L 7/087; H03L 7/081; H03L 7/091
See application file for complete search history.

(56) References Cited

U.S. PATENT DOCUMENTS

| | | |
|---|---|---|
| 8,023,606 B2 | 9/2011 | Ozawa |
| 8,432,199 B2 | 4/2013 | Lee |

(Continued)

FOREIGN PATENT DOCUMENTS

| | | |
|---|---|---|
| KR | 10-0967809 B1 | 7/2010 |
| KR | 10-2014-0134926 A | 11/2014 |

OTHER PUBLICATIONS

Lucio Rodoni et al., "A 5.75 to 44 Gb/s Quarter Rate CDR With Data Rate Selection in 90 nm Bulk CMOS," IEEE, 2009.

(Continued)

*Primary Examiner* — David S Huang

(57) ABSTRACT

Disclosed are a digital CDR circuit and a feedback loop circuit including the same. The digital CDR circuit includes a phase detector that receives an input signal and outputs a phase detection result signal corresponding to a determination result for a sampling time based on the input signal, a charge pump that receives the phase detection result signal and outputs an amplified signal obtained by multiplying the phase detection result signal by a gain, a loop filter that receives the amplified signal and filters the amplified signal to output a filtered signal, and a phase shift control code generator that generates a control signal for controlling a phase of a signal based on the filtered signal, and the input signal includes plural data signals and plural error signals, and the data signals and the error signals are digital signals which are quantized based on a signal magnitude.

14 Claims, 5 Drawing Sheets

(56) References Cited

U.S. PATENT DOCUMENTS

| | | |
|---|---|---|
| 8,594,262 B2 | 11/2013 | Slezak |
| 10,791,009 B1 | 9/2020 | Wu et al. |
| 11,469,877 B1* | 10/2022 | Raj .................... H04L 25/4917 |
| 2005/0180287 A1 | 8/2005 | Lee |
| 2006/0192622 A1* | 8/2006 | Narita ................... H03L 7/0805 331/16 |
| 2011/0148490 A1 | 6/2011 | Lee |
| 2013/0148712 A1* | 6/2013 | Malipatil ................ H04L 7/033 375/233 |
| 2014/0132320 A1 | 5/2014 | Sindalovsky |
| 2015/0146833 A1* | 5/2015 | Byun .................... H03L 7/0802 375/371 |
| 2015/0188693 A1 | 7/2015 | Giaconi |

OTHER PUBLICATIONS

Jay Im et al., "A 40-to-56 Gb/s PAM-4 Receiver With Ten-Tap Direct Decision-Feedback Equalization in 16-nm FinFET," IEEE, 2017.

* cited by examiner

DIGITAL CLOCK AND DATA RECOVERY CIRCUIT AND FEEDBACK LOOP CIRCUIT INCLUDING THE SAME

CROSS-REFERENCE TO RELATED APPLICATIONS

This application claims priority under 35 U.S.C. § 119 to Korean Patent Application No. 10-2021-0141478, filed on Oct. 22, 2021, in the Korean Intellectual Property Office, the disclosures of which are incorporated by reference herein in their entireties.

BACKGROUND

Embodiments of the present disclosure described herein relate to data communication technology, and more particularly, relate to a digital clock and data recovery (CDR) circuit using quantization of a signal magnitude and a feedback loop circuit including the same.

A clock and data recovery circuit (hereinafter referred to as a CDR circuit) is a circuit on a receiving side used to extract an appropriate clock from an incoming serial data stream, to sample the received data again based on the extracted clock, and to reconstruct the received data accurately in time. In data communication, since it is difficult to accurately match the symbol transmission rate of the transmitting side and the sampling rate of the receiving side, the CDR circuit serves to accurately maintain clock synchronization for accurate reproduction and restoration of the original signal. In detail, the CDR circuit serves to reduce the phase difference between the extracted clock and the data stream.

The CDR circuit may be implemented with an analog CDR circuit or a digital CDR circuit. For example, the analog CDR circuit may include a resistor, a capacitor, a full-wave rectifier, a band pass filter, and a limiter. The analog CDR circuit may receive data through an input unit and may output a sine wave clock through an output unit. In contrast, as an example, the digital CDR circuit may include a phase-locked loop circuit (hereinafter referred to as a PLL circuit) and a D flip-flop circuit. The digital CDR circuit may receive data through an input unit and output data in which a clock and timing in the form of a digital signal are reconstructed through an output unit.

SUMMARY

Embodiments of the present disclosure provide a digital clock and data recovery (CDR) circuit using quantization of a signal magnitude and a feedback loop circuit including the same.

According to an embodiment of the present disclosure, the digital CDR circuit includes a phase detector that receives an input signal and outputs a phase detection result signal corresponding to a determination result for a sampling time based on the input signal, a charge pump that receives the phase detection result signal and outputs an amplified signal obtained by multiplying the phase detection result signal by a gain, a loop filter that receives the amplified signal and filters the amplified signal to output a filtered signal, and a phase shift control code generator that generates a control signal for controlling a phase of a signal based on the filtered signal, and the input signal includes a plurality of data signals and a plurality of error signals, and the plurality of data signals and the plurality of error signals are digital signals which are quantized based on a signal magnitude.

According to an embodiment, the phase detector may include a plurality of phase detection units that outputs determination signals for the sampling time based on the plurality of data signals and the plurality of error signals, and a summator that sums each of the determination signals output from the plurality of phase detection units.

According to an embodiment, each of the plurality of phase detection units may receive three data signals and one error signal, the three data signals may include first input data which is sampling data before a current time, second input data which is sampling data of the current time, and third input data which is sampling data after the current time, and the one error signal is an error signal extracted at the current time.

According to an embodiment, the first input data, the second input data, and the third input data may be 2 bits, respectively, and the one error signal may be 1 bit.

According to an embodiment, each of the plurality of phase detection units may include a plurality of first elements that operate a difference between two input data values of the first input data, the second input data, and the third input data, a plurality of second elements that receive an operation result of any one of the plurality of first elements, output a result value of '1' when the received operation result of the any one of the plurality of first elements is the same as a given value, and output a result value of '0' when the received operation result of the any one of the plurality of first elements is different from the given value, a plurality of third elements that perform a NOT operation on the one error signal at the current time, a plurality of fourth elements that receive an operation result value of any one of the plurality of second elements and the one error signal and perform an AND operation on the received operation result value of the any one of the plurality of second elements and the one error signal, a plurality of fifth elements that receive the operation result value of the any one of the plurality of second elements and an operation result value of any one of the plurality of third elements and perform an AND operation on the received operation result value of the any one of the plurality of second elements and the received operation result value of the any one of the plurality of third elements, a plurality of sixth elements that receive an operation result value of any one of the plurality of fourth elements and an operation result value of any one of the plurality of fifth elements and perform an OR operation on the received operation result value of the any one of the plurality of fourth elements and the received operation result value of the any one of the plurality of fifth elements, a seventh element that receives operation result values of a first group of the plurality of sixth elements, performs an OR operation based on the received operation result values of the first group, and outputs a first signal corresponding to the sampling time, an eighth element that receives operation result values of a second group of the plurality of sixth elements, performs an OR operation based on the received operation result values of the second group, and outputs a second signal corresponding to the sampling time, and a ninth element that receives the first signal and the second signal and outputs the determination signal based on a difference between the first signal and the second signal.

According to an embodiment, each of the plurality of second elements may determine whether the received operation result of the any one of the plurality of first elements is the same as 1, 2, or 3, when the received operation result of the any one of the plurality of first elements is the same as 1, 2, or 3, may output the operation result value of '1', and when the received operation result of the any one of the plurality of first elements is not the same as 1, 2, or 3, may output the operation result value of '0'.

According to an embodiment, each of the determination signals for the sampling time may be any one of an early determination signal indicating that the sampling time is before an ideal sampling time, an ideal determination signal indicating that the sampling time is the ideal sampling time, and a late determination signal indicating that the sampling time is after the ideal sampling time.

According to an embodiment of the present disclosure, a feedback loop circuit includes a CTLE&VGA (continuous time linear equalizer & variable gain amplifier) circuit that receives an input signal from an outside and amplifies a magnitude of a signal corresponding to a frequency greater than or equal to a threshold, an analog-to-digital converter that receives the amplified signal and quantizes the amplified signal to convert the quantized amplified signal into a digital signal, a deserializer circuit that receives the converted digital signal and parallelizes the converted digital signal, a digital CDR (clock and data recovery) circuit that receives the parallelized digital signal and generates a control code for controlling a sampling time of the input signal based on the parallelized digital signal, a PLL (phase-locked loop) circuit that receives a clock signal from an oscillator, adjusts a frequency of the clock signal, and outputs an output clock signal of which a frequency is controlled, and a PS (phase shifter) circuit that receives the control code and the output clock signal and controls a phase of the output clock signal based on the control code, and the PS circuit transfers the output clock signal of which the frequency is controlled to the analog-to-digital converter, and the analog-to-digital converter performs sampling on the input signal based on the output clock signal of which the frequency is controlled.

According to an embodiment, the digital CDR circuit may include a phase detector that receives the parallelized digital signal and outputs a phase detection result signal corresponding to a determination result for a sampling time based on the parallelized digital signal, a charge pump that receives the phase detection result signal and outputs an amplified signal obtained by multiplying the phase detection result signal by a gain, a loop filter that receives the amplified signal and filters the amplified signal to output a filtered signal, and a phase shift control code generator that generates a control signal for controlling a phase of the output clock signal based on the filtered signal, and the parallelized digital signal may include a plurality of data signals and a plurality of error signals.

According to an embodiment, the phase detector may include a plurality of phase detection units that outputs determination signals for the sampling time based on the plurality of data signals and the plurality of error signals, and a summator that sums each of the determination signals output from the plurality of phase detection units.

According to an embodiment, each of the plurality of phase detection units may receive three data signals and one error signal, the three data signals may include first input data which is sampling data before a current time, second input data which is sampling data of the current time, and third input data which is sampling data after the current time, and the one error signal may be an error signal extracted at the current time.

According to an embodiment, the first input data, the second input data, and the third input data may be 2 bits, respectively, and the one error signal may be 1 bit.

According to an embodiment, each of the plurality of phase detection units may include a plurality of first elements that operate a difference between two input data values of the first input data, the second input data, and the third input data, a plurality of second elements that receive an operation result of any one of the plurality of first elements, output a result value of '1' when the received operation result of the any one of the plurality of first elements is the same as a given value, and output a result value of '0' when the received operation result of the any one of the plurality of first elements is different from the given value, a plurality of third elements that perform a NOT operation on the one error signal at the current time, a plurality of fourth elements that receive an operation result value of any one of the plurality of second elements and the one error signal and perform an AND operation on the received operation result value of the any one of the plurality of second elements and the one error signal, a plurality of fifth elements that receive the operation result value of the any one of the plurality of second elements and an operation result value of any one of the plurality of third elements and perform an AND operation on the received operation result value of the any one of the plurality of second elements and the received operation result value of the any one of the plurality of third elements, a plurality of sixth elements that receive an operation result value of any one of the plurality of third elements and an operation result value of any one of the plurality of fifth elements and perform an OR operation on the received operation result value of the any one of the plurality of third elements and the received operation result value of the any one of the plurality of fifth elements, a seventh element that receives operation result values of a first group of the plurality of sixth elements, performs an OR operation based on the received operation result values of the first group, and outputs a first signal corresponding to the sampling time, an eighth element that receives operation result values of a second group of the plurality of sixth elements, performs an OR operation based on the received operation result values of the second group, and outputs a second signal corresponding to the sampling time, and a ninth element that receives the first signal and the second signal and outputs the determination signal based on a difference between the first signal and the second signal.

According to an embodiment, each of the plurality of second elements may determine whether the received operation result of the any one of the plurality of first elements is the same as 1, 2, or 3, when the received operation result of the any one of the plurality of first elements is the same as 1, 2, or 3, may output the operation result value of '1', and when the received operation result of the any one of the plurality of first elements is not the same as 1, 2, or 3, may output the operation result value of '0'.

According to an embodiment, each of the determination signals for the sampling time may be any one of an early determination signal indicating that the sampling time is before an ideal sampling time, an ideal determination signal indicating that the sampling time is the ideal sampling time, and a late determination signal indicating that the sampling time is after the ideal sampling time.

BRIEF DESCRIPTION OF THE FIGURES

The above and other objects and features of the present disclosure will become apparent by describing in detail embodiments thereof with reference to the accompanying drawings.

DETAILED DESCRIPTION

Figure 1:
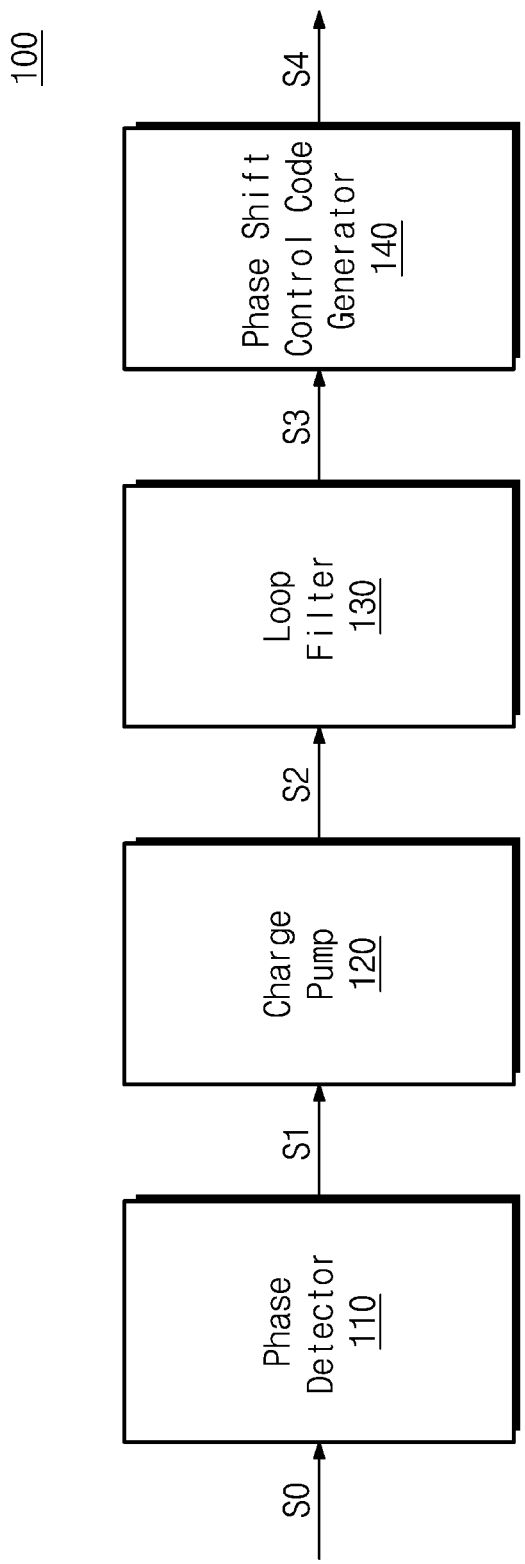
FIG. 1 is a block diagram illustrating a digital CDR circuit, according to an embodiment of the present disclosure.

Hereinafter, embodiments of the present disclosure will be described clearly and in detail such that those skilled in the art may easily carry out the present disclosure.

The terms used in the present specification are provided to describe the embodiments, not to limit the present disclosure. In the present specification, the singular form also includes the plural form unless otherwise specified in the phrase. As used herein, "comprises and/or comprising" does not exclude the presence or addition of one or more other components, steps, operations and/or elements to the mentioned components, steps, operations and/or elements.

In the specification, the term "first and/or second" will be used to describe various elements but will be described only for the purpose of distinguishing one element from another element, not limiting an element of the corresponding term. For example, without departing the scope of the present disclosure, a first element may be referred to as a second element, and similarly, a second element may be referred to as a first element.

Unless otherwise defined, all terms (including technical and scientific terms) used in the present specification may be used as meanings commonly understood by those skilled in the art to which the present disclosure pertains. In addition, terms defined in the commonly used dictionary are not interpreted ideally or excessively unless explicitly defined specifically. In the present specification, the same reference numerals may refer to the same components throughout the entire text.

FIG. 1 is a block diagram illustrating a digital CDR circuit, according to an embodiment of the present disclosure. Referring to FIG. 1, a digital CDR circuit 100 according to an embodiment of the present disclosure includes a phase detector 110, a charge pump 120, a loop filter 130, and a phase shift control code generator 140.

The phase detector 110 may receive an input signal S0 and may output a phase detection result signal S1 for the input signal S0 based on the input signal S0. In an embodiment according to the present disclosure, the input signal S0 may include a plurality of data signals and a plurality of error signals. The plurality of data signals and the plurality of error signals included in the input signal S0 may be digital signals quantized based on a magnitude of the signal. The error signal refers to a signal for indicating a difference between signal levels at an ideal sampling time and a sampling time. A detailed description of the error signal will be described later in more detail with reference to FIG. 3 to be described later. The phase detector 110 may perform a logic operation based on the input signal S0 and may output the phase detection result signal S1 to the charge pump 120. A specific operation method of the phase detector 110 will be described in more detail with reference to FIGS. 2 and 4 to be described later.

The charge pump 120 may receive the phase detection result signal S1 from the phase detector 110. The charge pump 120 may amplify the received phase detection result signal S1 by multiplying a gain. The charge pump 120 may output the amplified signal S2 obtained by multiplying the phase detection result signal S1 by the gain to the loop filter 130.

The loop filter 130 may receive the amplified signal S2 output from the charge pump 120. The loop filter 130 may filter unnecessary signals by comparing output frequency information and reference frequency information through a loop. The loop filter 130 may output the filtered signal S3 to the phase shift control code generator 140.

The phase shift control code generator 140 may receive the filtered signal S3. The phase shift control code generator 140 may generate a control code S4 for controlling a phase of a signal based on the received filtered signal S3. The phase shift control code generator 140 may output the generated control code S4.

The digital CDR circuit 100 according to the present disclosure may automatically derive an optimal phase value of the sampling clock by using quantization of the signal magnitude. In addition, by designing the digital CDR circuit 100 through a logic circuit, the simpler digital CDR circuit 100 may be implemented.

Figure 2:
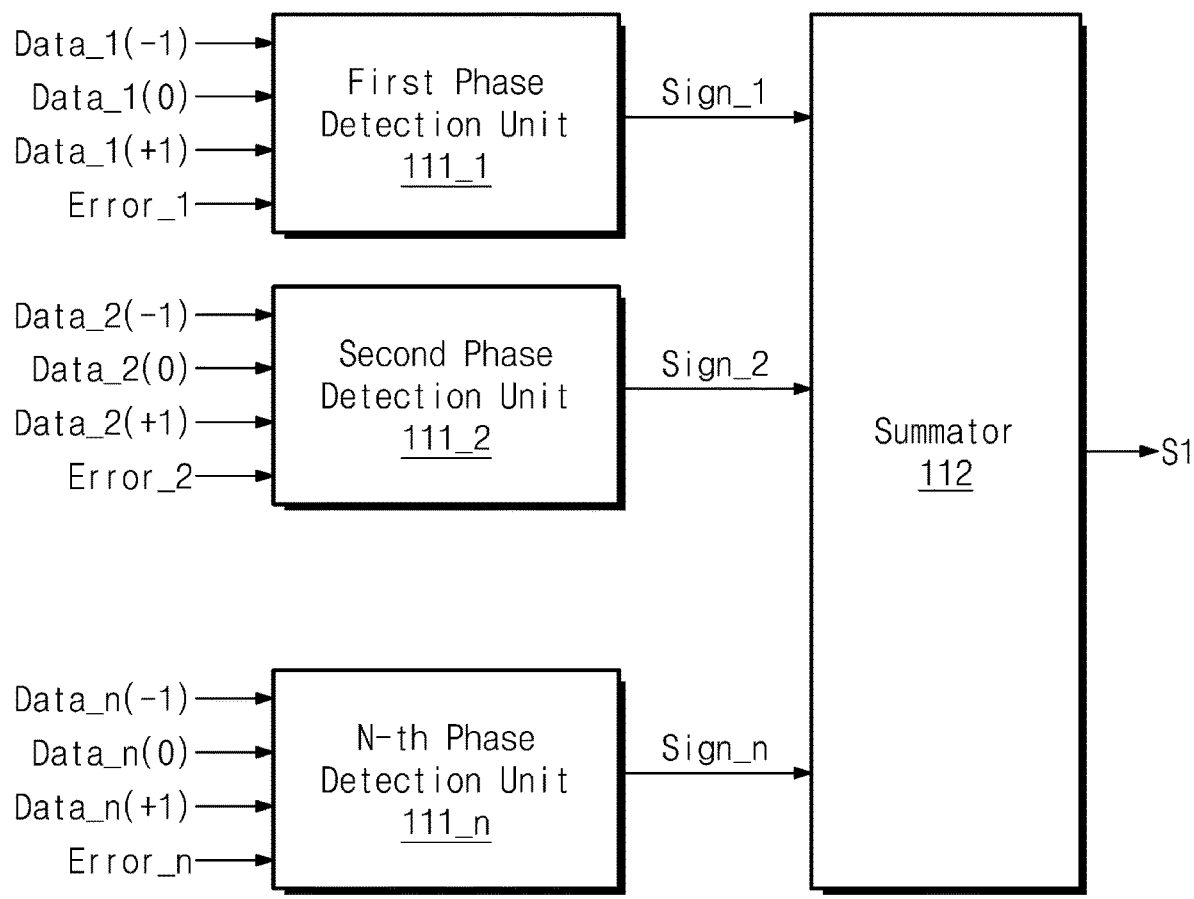
FIG. 2 is a block diagram illustrating a phase detector in more detail, according to an embodiment of the present disclosure.

FIG. 2 is a block diagram illustrating the phase detector 110 in more detail, according to an embodiment of the present disclosure. Referring to FIG. 2, the phase detector 110 according to an embodiment of the present disclosure may include a plurality of phase detection units 111_1, 111_2, ..., 111_n and a summator 112.

The first phase detection unit 111_1 may receive three input data Data_1(−1), Data_1(0), Data_1(+1) and one error signal Error_1. The three input data Data_1(−1), Data_1(0), Data_1(+1) and the one error signal Error_1 may be included in the input signal S0 (refer to FIG. 1) illustrated in FIG. 1. Each of the three input data Data_1(−1), Data_1(0), and Data_1(+1) may be 2-bit data, and the one error signal Error_1 may be 1-bit data. The first phase detection unit 111_1 may output a first determination signal Sign_1 for the sampling time, based on the received signals Data_1(−1), Data_1(0), Data_1(+1), and Error_1.

The second phase detection unit 111_2 may also receive three input data Data_2(−1), Data_2(0), Data_2(+1) and one error signal Error_2, and may output a second determination signal Sign_2 for the sampling time, based on the received signals Data_2(−1), Data_2(0), Data_2(+1), and Error_2. The n-th phase detection unit 111_n also may also receive three input data Data_n(−1), Data_n(0), Data_n(+1) and one error signal Error_n, and may output an n-th determination signal Sign_n for the sampling time, based on the received signals Data_n(−1), Data_n(0), Data_n(+1), and Error_n.

The first input data Data_1(−1), Data_2(−1), ..., Data_n(−1)) for the first to n-th phase detection units 111_1, 111_2, ..., 111_n mean data before the current time. The second input data Data_1(0), Data_2(0), ..., Data_n(0)) for the first to n-th phase detection units 111_1, 111_2, ..., 111_n mean data at the current time. The third input data Data_1(+1), Data_2(+1), ..., Data_n(+1)) for the first to n-th phase detection units 111_1, 111_2, ..., 111_n mean data after the current time. The error signals Error_1, Error_2, ..., Error_n for the first to n-th phase detection units 111_1, 111_2, ..., 111_n may be sampled at the same time as second input data Data_1(0), Data_2(0), . . . , Data_n(0) for the first to n-th phase detection units 111_1, 111_2, . . . , 111_n.

Each of the first to n-th determination signals Sign_1, Sign_2, . . . , Sign_n may be any one of an early determination signal indicating that the sampling time is before an ideal sampling time, an ideal determination signal indicating that the sampling time is at the ideal sampling time, and a late determination signal indicating that the sampling time is after the ideal sampling time. The principle of deriving the first to n-th determination signals Sign_1, Sign_2, . . . , Sign_n from the first to n-th phase detection units 111_1, 111_2, . . . , 111_n will be described in detail with reference to FIG. 4 to be described later.

The summator 112 may receive the first to n-th determination signals Sign_1, Sign_2, . . . , Sign_n from the first to n-th phase detection units 111_1, 111_2, . . . , 111_n. The summator 112 may sum the received first to n-th determination signals Sign_1, Sign_2, . . . , Sign_n. The summator 112 may output a result value of adding all of the first to n-th determination signals Sign_1, Sign_2, . . . , Sign_n as the phase detection result signal S1.

Figure 3:
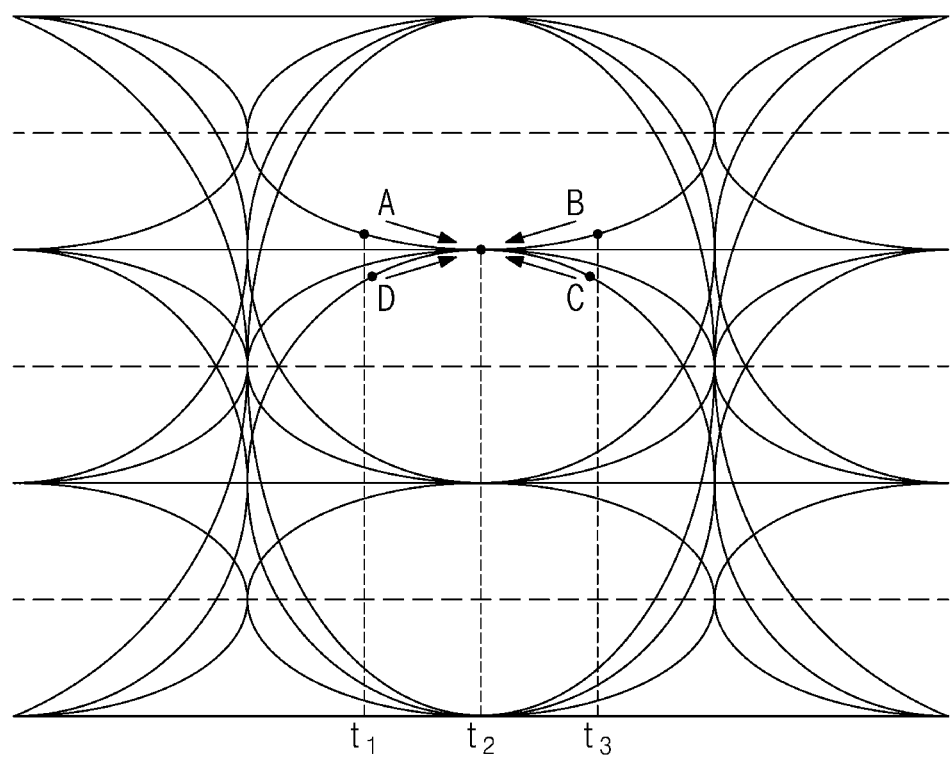
FIG. 3 is a diagram for describing a general principle of a phase detector using quantization of a signal magnitude.

FIG. 3 is a diagram for describing a general principle of a phase detector using quantization of a signal magnitude. In more detail, FIG. 3 is a diagram for describing the principle of determining a sampling time in a pulse-amplitude modulation (PAM)4 phase detector using quantization of a signal amplitude in general. In an eye diagram illustrated in FIG. 3, three horizontal dotted lines mean a level at which a signal is quantized to 2 bits. In the eye diagram illustrated in FIG. 3, four horizontal solid lines mean a level at which an error signal is quantized to 1 bit.

On the eye diagram, an ideal sampling time is a time t2, and a value of an error signal may be determined based on the time t2. For example, at a point A and a point B, the error signal value may be determined to be 1 since the level of the signal is greater than the level of the signal at the time t2. Also, at a point C and a point D, since the level of the signal is smaller than the level of the signal at the time t2, the error signal value may be determined to be '−1'.

When the signal is sampled at the point A of FIG. 3, the data slope falls and the value of the error signal is '1', so the phase detector may determine that the signal sampling at the point A is performed in an early section. The early section means that the sampling time is before the ideal sampling time.

When the signal is sampled at the point B of FIG. 3, the data slope rises and the value of the error signal is '1', so the phase detector may determine that the signal sampling at the point B is performed in a late section. The late section means that the sampling time is after the ideal sampling time.

When the signal is sampled at the point C in FIG. 3, the data slope falls and the value of the error signal is '−1', so the phase detector may determine that the signal sampling at the point C is performed in the late section, and when the signal is sampled at the point D, the data slope rises and the value of the error signal is '−1', so the phase detector may determine that the signal sampling at the point D is performed in the early section.

Figure 4:
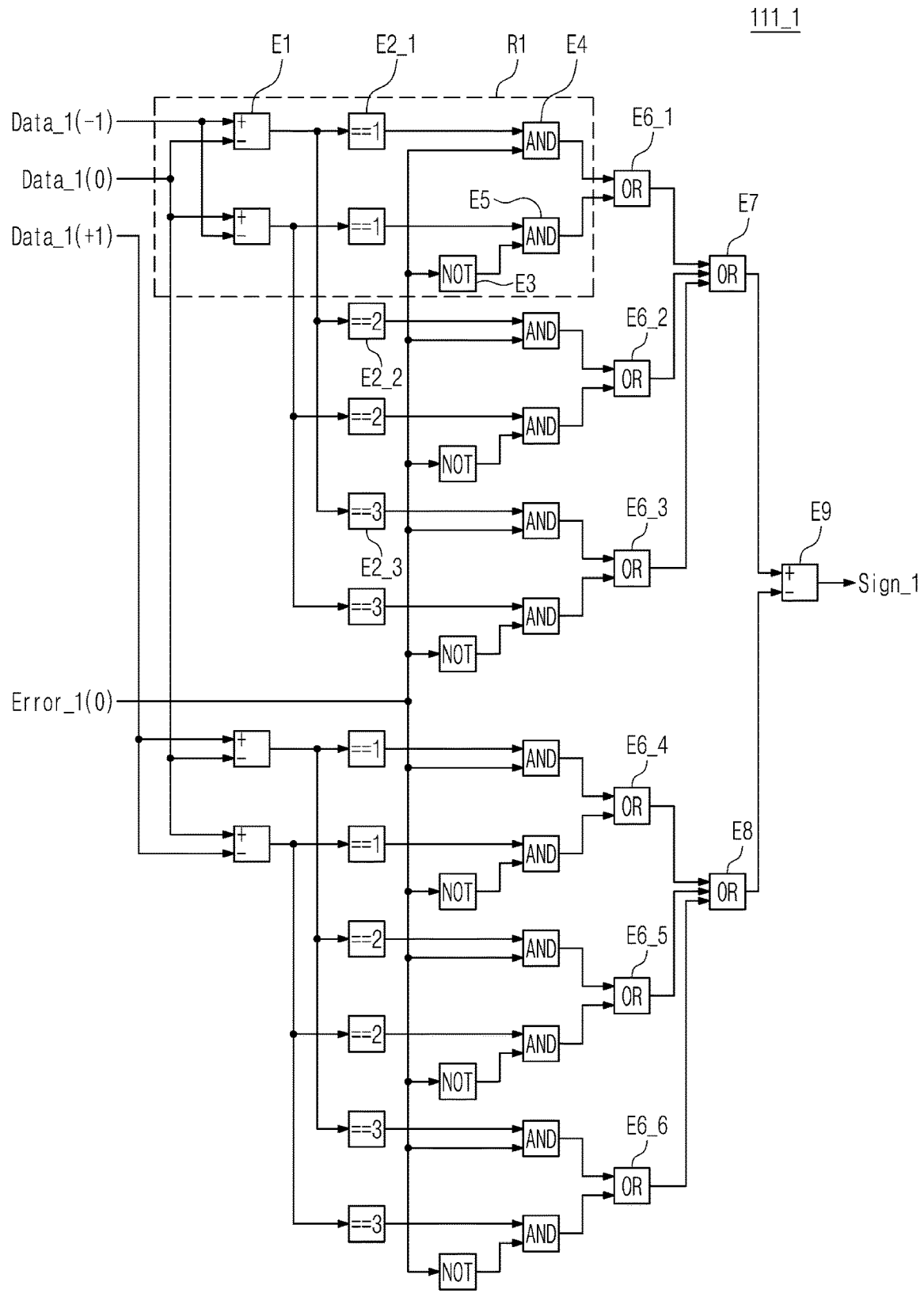
FIG. 4 is a circuit diagram for describing a detailed configuration and operation principle of a first phase detection unit, according to an embodiment of the present disclosure.

FIG. 4 is a circuit diagram for describing a detailed configuration and operation principle of the first phase detection unit 111_1 (refer to FIG. 2), according to an embodiment of the present disclosure. A principle of detecting a phase of a signal according to an embodiment of the present disclosure will be described in detail with reference to the logic circuit diagram illustrated in FIG. 4. For convenience of description, the configuration and operation principle of the logic circuit diagram will be described in detail with reference to a partial region R1 of FIG. 4, and additional description about components that perform the same or similar functions as those included in the partial region R1 will be omitted to avoid redundancy.

A first element E1 illustrated in FIG. 4 may derive a difference value between input data. The difference value of the data means a value obtained by subtracting data input through a negative (−) terminal of the first element E1 from data input through a positive (+) terminal of the first element E1. Second elements E2_1, E2_2, and E2_3 derive an operation result of the first element E1 as an output. For example, the second element E2_1 outputs '1' when the operation result of the first element E1 is the same as '1', and outputs '0' when the operation result of the first element E1 is not the same as '1'. For example, the second element E2_2 outputs '1' when the operation result of the first element E1 is the same as '2', and outputs '0' when the operation result of the first element E1 is not the same as '2'. For example, the second element E2_3 outputs '1' when the operation result of the first element E1 is the same as '3', and outputs '0' when the operation result of the first element E1 is not the same as '3'.

A third element E3 may perform a NOT operation on an input digital signal. For example, the third element E3 performs the NOT operation on an error signal Error_1(0). A fourth element E4 and a fifth element E5 perform an AND operation. For example, the fourth element E4 performs an AND operation on the operation result value of the second element E2_1 and the error signal Error_1(0), and the fifth element E5 performs an AND operation on the operation result value of any one of the second elements E2_1, E2_2, and E2_3 and an operation result value of the third element E3.

Sixth elements E6_1, E6_2, E6_3, E6_4, E6_5, and E6_6 perform an OR operation. For example, the sixth element E6_1 performs an OR operation on the operation result value of the fourth element E4 and the operation result value of the fifth element E5. Since the sixth elements E6_2, E6_3, E6_4, E6_5, and E6_6 are similar to the sixth element E6_1, additional description thereof will be omitted to avoid redundancy.

A seventh element E7 and an eighth element E8 perform an OR operation. The seventh element E7 performs an OR operation on the operation result values of the sixth elements E6_1, E6_2, and E6_3. The sixth elements E6_1, E6_2, and E6_3 may be referred to as a first group. The seventh element E7 may output a first signal corresponding to a sampling time of a result of performing the OR operation. The eighth element E8 performs an OR operation on the operation result values of the sixth elements E6_4, E6_5, and E6_6. The sixth elements E6_4, E6_5, and E6_6 may be referred to as a second group. The eighth element E8 may output a second signal corresponding to a sampling time of a result of performing the OR operation. The ninth element E9 operates a difference between the first signal and the second signal. The ninth element E9 outputs the first determination signal Sign_1 based on the difference between the first signal and the second signal. In the partial region R1 of FIG. 4, the first phase detection unit 111_1 may perform logical operations on the first input data Data_1(−1) for the first phase detection unit 111_1, the second input data Data_1(0) for the first phase detection unit 111_1, and the error signal Error_1(0). The error signal Error_1(0) may be an error signal of the current time. For example, when the first input data Data_1(−1) for the first phase detection unit 111_1 is '1', and the second input data Data_1(0) for the first phase detection unit 111_1 is '0', the operation result of the first element E1 may be derived as '1', and accordingly, the second element E2 may output '1' as a result value. When the result value of the second element E2_1 is '1', it means that the data signal is in a falling state.

The state of the sampling time may be determined through an AND operation of the result value of the second element E2_1 and the error signal Error_1(0). For example, when the result value of the second element E2_1 is '1' and the error signal Error_1(0) is '1', the result value of '1' may be derived through an AND operation, which means that the sampling time is in the early section. For example, when the result value of the second element E2_1 is '1' and the error signal Error_1(0) is '−1', the result value of '−1' may be derived through an AND operation, which means that the sampling time is in the late section.

According to the above-described principle, the first phase detection unit 111_1 may derive sampling time determination results for all cases where the difference between first before and after data is 1, 2, and 3, and may perform an OR operation with respect to the sampling time determination results for the all cases to derive an early final signal and a late final signal with respect to the sampling time. Operation of "early final signal-the late final signal" may be performed on the final result signals derived through the OR operation, and the corresponding result may be output as the first determination signal Sign_1.

For example, when the result of "early final signal-late final signal" is '1', it means that the current sampling time is before the ideal sampling time, and in this case, the first determination signal Sign_1 may be the early determination signal. For example, when the result of "early final signal-late final signal" is '0', it means that the current sampling time is the ideal sampling time, and in this case, the first determination signal Sign_1 may be the ideal determination signal. For example, when the result of "early final signal-late final signal" is '−1', it means that the current sampling time is after the ideal sampling time, and in this case, the first determination signal Sign_1 may be the late determination signal.

In FIG. 4, the first phase detection unit 111_1 has been described, but the second to n-th phase detection units 111_2, . . . , 111_n illustrated in FIG. 2 may also be implemented with the same configuration as the first phase detection unit 111_1 illustrated in FIG. 4. The second to n-th determination signals Sign_2, . . . , Sign_n, which are output signals of the second to n-th phase detection units 111_2, . . . , 111_n disclosed in FIG. 2, are also to be derived by applying the same principle as described above, and the first to n-th determination signals Sign_1, Sign_2, . . . , Sign_n output from the first to n-th phase detection units 111_1, 111_2, . . . , 111_n may be received to the summator 112 (refer to FIG. 2) to be summed all together.

Figure 5:
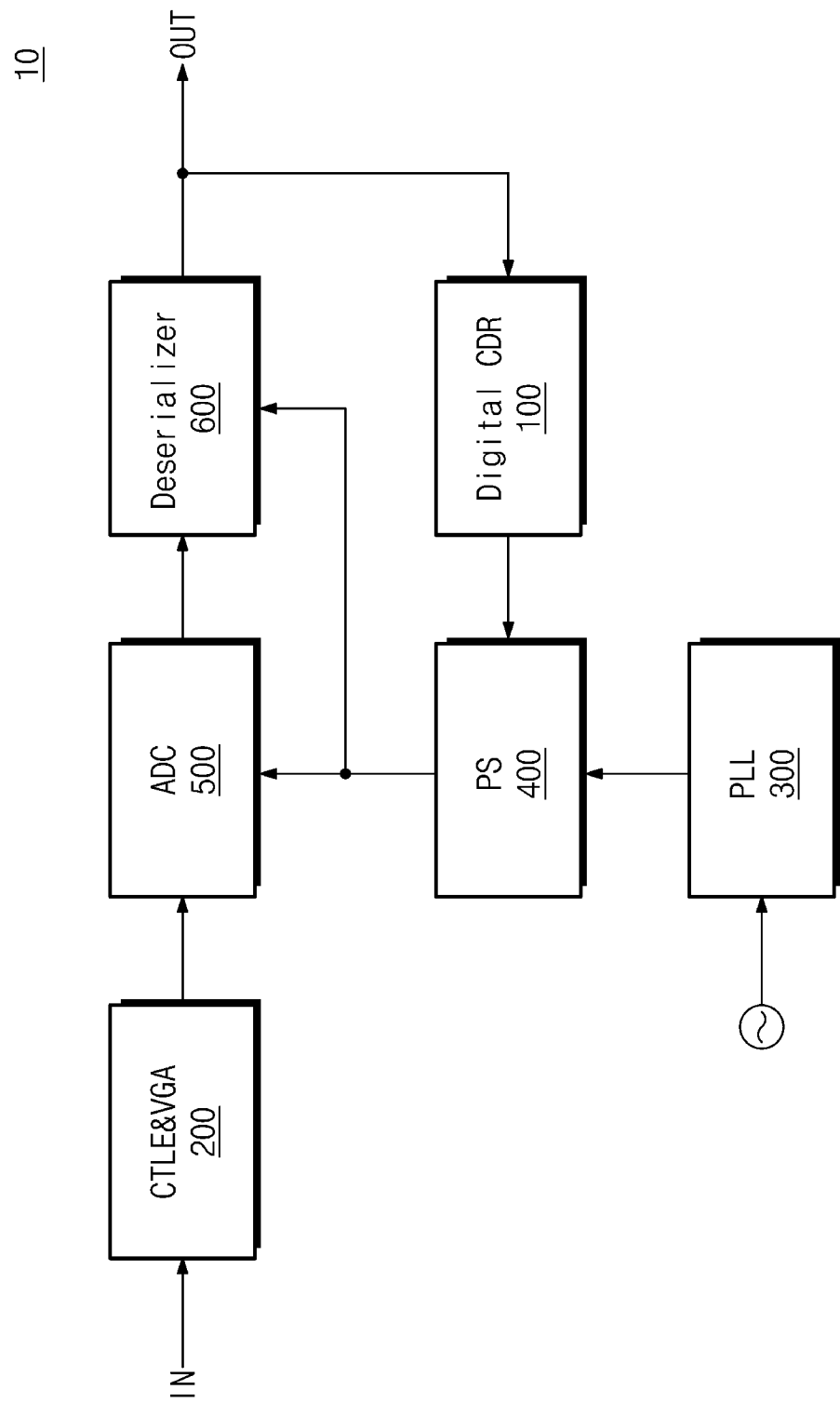
FIG. 5 is a block diagram illustrating a feedback loop circuit including a digital CDR circuit, according to the present disclosure.

FIG. 5 is a block diagram illustrating a feedback loop circuit 10 including the digital CDR circuit 100, according to the present disclosure. Referring to FIG. 5, the feedback loop circuit 10 may include the digital CDR circuit 100, a continuous time linear equalizer & variable gain amplifier (CTLE&VGA) circuit 200, a phase-locked loop (PLL) circuit 300, a phase shifter (PS) circuit 400, an analog-to-digital converter (ADC) 500, and a deserializer 600. For example, the feedback loop circuit 10 may be included and used in an equipment on a receiving side of a communication system.

The CTLE&VGA circuit 200 may receive an input signal IN from the outside. The input signal IN may be an analog signal received from the transmitting side of the communication system. The CTLE&VGA circuit 200 may amplify amplitudes of signals having a high frequency of the input signal IN to adjust all frequency components of the input signal IN to have similar amplitudes. The high frequency means a frequency above a predetermined threshold value. By adjusting the amplitude, a channel loss of the input signal IN may be compensated.

The amplitude-adjusted input signal may be output to the ADC 500. The ADC 500 may quantize the amplitude-adjusted input signal. The ADC 500 may quantize the amplitude-adjusted input signal to 'M'-bit. The digital signal quantized by the ADC 500 may be output to the deserializer 600.

The deserializer 600 may parallelize the received M-bit digital signal into 'M'-bit digital signals having 'n' numbers. In this case, 'n' denotes the number of the plurality of phase detection units 111_1, 111_2, . . . , 111_n included in the digital CDR circuit 100. The parallelized digital signal from the deserializer 600 may be output to each of the plurality of phase detection units 111_1, 111_2, . . . , 111_n included in the digital CDR circuit 100. The M-bit digital signal may include 2-bit data of the current time and 1-bit error signal, and may include 2-bit data before the current time and 2-bit data after the current time in some cases.

The digital CDR circuit 100 may detect a phase with respect to the input signal as described in FIGS. 1, 2 and 4, and may output a control code for controlling the sampling time of the input signal based on the result to the PS circuit 400. The PLL circuit 300 may adjust the frequency of the clock signal by using a phase difference between a signal introduced from an oscillator and a signal fed back from an output. The PLL circuit 300 may output a frequency-controlled clock signal to the PS circuit 400.

The PS circuit 400 may adjust the phase of the output clock signal based on the clock signal received from the PLL circuit 300 and the control code received from the digital CDR circuit 100. The PS circuit 400 may transfer the phase-adjusted output clock signal to the ADC 500 and the deserializer 600 to adjust the sampling time of data. The data signal OUT extracted at the ideal sampling time may be output to the outside.

According to an embodiment of the present disclosure, a digital CDR circuit and a feedback loop circuit including the same may derive the optimal phase value of sampling clock of the analog-to-digital converter (ADC).

According to an embodiment of the present disclosure, a digital CDR circuit and a feedback loop circuit including the same may allow a simpler type of circuit to be designed.

The above description refers to embodiments for implementing the present disclosure. Embodiments in which a design is changed simply or which are easily changed may be included in the present disclosure as well as an embodiment described above. In addition, technologies that are easily changed and implemented by using the above embodiments may be included in the present disclosure. While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:
1. A digital CDR circuit comprising:
a phase detector configured to receive an input signal and to output a phase detection result signal corresponding to a determination result for a sampling time based on the input signal;

a charge pump configured to receive the phase detection result signal and to output an amplified signal obtained by multiplying the phase detection result signal by a gain;

a loop filter configured to receive the amplified signal and to filter the amplified signal to output a filtered signal; and a phase shift control code generator configured to generate a control signal for controlling a phase of a signal based on the filtered signal, and wherein the input signal includes a plurality of data signals and a plurality of error signals, and wherein the plurality of data signals and the plurality of error signals are digital signals which are quantized based on a signal magnitude.

2. The digital CDR circuit of claim 1, wherein the phase detector includes:

a plurality of phase detection units configured to output determination signals for the sampling time based on the plurality of data signals and the plurality of error signals; and a summator configured to sum each of the determination signals output from the plurality of phase detection units.

3. The digital CDR circuit of claim 2, wherein each of the plurality of phase detection units receives three data signals and one error signal, wherein the three data signals include first input data which is sampling data before a current time, second input data which is sampling data of the current time, and third input data which is sampling data after the current time, and wherein the one error signal is an error signal extracted at the current time.

4. The digital CDR circuit of claim 3, wherein the first input data, the second input data, and the third input data are 2 bits, respectively, and the one error signal is 1 bit.

5. The digital CDR circuit of claim 3, wherein each of the plurality of phase detection units includes:

a plurality of first elements configured to operate a difference between two input data values of the first input data, the second input data, and the third input data;

a plurality of second elements configured to receive an operation result of any one of the plurality of first elements, to output a result value of '1' when the received operation result of the any one of the plurality of first elements is the same as a given value, and to output a result value of '0' when the received operation result of the any one of the plurality of first elements is different from the given value;

a plurality of third elements configured to perform a NOT operation on the one error signal at the current time;

a plurality of fourth elements configured to receive an operation result value of any one of the plurality of second elements and the one error signal, to perform an AND operation on the received operation result value of the any one of the plurality of second elements and the one error signal;

a plurality of fifth elements configured to receive the operation result value of the any one of the plurality of second elements and an operation result value of any one of the plurality of third elements, to perform an AND operation on the received operation result value of the any one of the plurality of second elements and the received operation result value of the any one of the plurality of third elements;

a plurality of sixth elements configured to receive an operation result value of any one of the plurality of fourth elements and an operation result value of any one of the plurality of fifth elements, to perform an OR operation on the received operation result value of the any one of the plurality of fourth elements and the received operation result value of the any one of the plurality of fifth elements;

a seventh element configured to receive operation result values of a first group of the plurality of sixth elements, to perform an OR operation based on the received operation result values of the first group, and to output a first signal corresponding to the sampling time;

an eighth element configured to receive operation result values of a second group of the plurality of sixth elements, to perform an OR operation based on the received operation result values of the second group, and to output a second signal corresponding to the sampling time; and a ninth element configured to receive the first signal and the second signal, to output the determination signal based on a difference between the first signal and the second signal.

6. The digital CDR circuit of claim 5, wherein each of the plurality of second elements is configured to:

determine whether the received operation result of the any one of the plurality of first elements is the same as 1, 2, or 3;

when the received operation result of the any one of the plurality of first elements is the same as 1, 2, or 3, output the operation result value of '1'; and when the received operation result of the any one of the plurality of first elements is not the same as 1, 2, or 3, output the operation result value of '0'.

7. The digital CDR circuit of claim 6, wherein each of the determination signals for the sampling time is any one of an early determination signal indicating that the sampling time is before an ideal sampling time, an ideal determination signal indicating that the sampling time is the ideal sampling time, and a late determination signal indicating that the sampling time is after the ideal sampling time.

8. A feedback loop circuit comprising:

a CTLE&VGA (continuous time linear equalizer & variable gain amplifier) circuit configured to receive an input signal from an outside and to amplify a magnitude of a signal corresponding to a frequency greater than or equal to a threshold;

an analog-to-digital converter configured to receive the amplified signal and to quantize the amplified signal to convert the quantized amplified signal into a digital signal;

a deserializer circuit configured to receive the converted digital signal and to parallelize the converted digital signal;

a digital CDR (clock and data recovery) circuit configured to receive the parallelized digital signal and to generate a control code for controlling a sampling time of the input signal based on the parallelized digital signal;

a PLL (phase-locked loop) circuit configured to receive a clock signal from an oscillator, to adjust a frequency of the clock signal, and to output an output clock signal of which a frequency is controlled; and a PS (phase shifter) circuit configured to receive the control code and the output clock signal, and to control a phase of the output clock signal based on the control code, wherein the PS circuit transfers the output clock signal of which the frequency is controlled to the analog-to-digital converter,
wherein the analog-to-digital converter performs sampling on the input signal based on the output clock signal of which the frequency is controlled, and
wherein the digital CDR circuit includes:
  a phase detector configured to receive the parallelized digital signal and to output a phase detection result signal corresponding to a determination result for a sampling time based on the parallelized digital signal;
  a charge pump configured to receive the phase detection result signal and to output an amplified signal obtained by multiplying the phase detection result signal by a gain;
  a loop filter configured to receive the amplified signal and to filter the amplified signal to output a filtered signal; and
  a phase shift control code generator configured to generate a control signal for controlling a phase of the output clock signal based on the filtered signal,
wherein the parallelized digital signal includes a plurality of data signals and a plurality of error signals.

9. The feedback loop circuit of claim 8, wherein the phase detector includes:
  a plurality of phase detection units configured to output determination signals for the sampling time based on the plurality of data signals and the plurality of error signals; and
  a summator configured to sum each of the determination signals output from the plurality of phase detection units.

10. The feedback loop circuit of claim 9, wherein each of the plurality of phase detection units receives three data signals and one error signal,
  wherein the three data signals include first input data which is sampling data before a current time, second input data which is sampling data of the current time, and third input data which is sampling data after the current time, and
  wherein the one error signal is an error signal extracted at the current time.

11. The feedback loop circuit of claim 10, wherein the first input data, the second input data, and the third input data are 2 bits, respectively, and the one error signal is 1 bit.

12. The feedback loop circuit of claim 11, wherein each of the plurality of phase detection units includes:
  a plurality of first elements configured to calculate a difference between two input data values of the first input data, the second input data, and the third input data;
  a plurality of second elements configured to receive an operation result of any one of the plurality of first elements, to output a result value of '1' when the received operation result of the any one of the plurality of first elements is the same as a given value, and to output a result value of '0' when the received operation result of the any one of the plurality of first elements is different from the given value;
  a plurality of third elements configured to perform a NOT operation on the one error signal at the current time;
  a plurality of fourth elements configured to receive an operation result value of any one of the plurality of second elements and the one error signal, to perform an AND operation on the operation result value of the any one of the received plurality of second elements and the one error signal;
  a plurality of fifth elements configured to receive the operation result value of the any one of the plurality of second elements and an operation result value of any one of the plurality of third elements, to perform an AND operation on the received operation result value of the any one of the plurality of second elements and the received operation result value of the any one of the plurality of third elements;
  a plurality of sixth elements configured to receive an operation result value of any one of the plurality of third elements and an operation result value of any one of the plurality of fifth elements, to perform an OR operation on the received operation result value of the any one of the plurality of third elements and the received operation result value of the any one of the plurality of fifth elements;
  a seventh element configured to receive operation result values of a first group of the plurality of sixth elements, to perform an OR operation based on the received operation result values of the first group, and to output a first signal corresponding to the sampling time;
  an eighth element configured to receive operation result values of a second group of the plurality of sixth elements, to perform an OR operation based on the received operation result values of the second group, and to output a second signal corresponding to the sampling time; and
  a ninth element configured to receive the first signal and the second signal, to output the determination signal based on a difference between the first signal and the second signal.

13. The feedback loop circuit of claim 12, wherein each of the plurality of second elements is configured to:
  determine whether the received operation result of the any one of the plurality of first elements is the same as 1, 2 or 3;
  when the received operation result of the any one of the plurality of first elements is the same as 1, 2 or 3, output the operation result value of '1'; and
  when the received operation result of the any one of the plurality of first elements is not the same as 1, 2, or 3, output the operation result value of '0'.

14. The feedback loop circuit of claim 13, wherein each of the determination signals for the sampling time is any one of an early determination signal indicating that the sampling time is before an ideal sampling time, an ideal determination signal indicating that the sampling time is the ideal sampling time, and a late determination signal indicating that the sampling time is after the ideal sampling time.

* * * * *